United States Patent [19]
Bray et al.

[11] Patent Number: 5,525,871
[45] Date of Patent: Jun. 11, 1996

[54] ELECTRODELESS DISCHARGE LAMP CONTAINING PUSH-PULL CLASS E AMPLIFIER AND BIFILAR COIL

[75] Inventors: Derek Bray, Los Altos; Timothy P. Murphy; Lance T. Klinger, both of Mountain View, all of Calif.

[73] Assignee: Diablo Research Corporation, Sunnyvale, Calif.

[21] Appl. No.: 382,824

[22] Filed: Feb. 3, 1995

Related U.S. Application Data

[63] Continuation of Ser. No. 230,451, Apr. 20, 1994, abandoned, which is a continuation of Ser. No. 955,528, Oct. 1, 1992, abandoned, which is a continuation-in-part of Ser. No. 894,020, Jun. 5, 1992, Pat. No. 5,387,850.

[51] Int. Cl.$^6$ ................................................ H05B 41/16
[52] U.S. Cl. .......................................... 315/248; 315/344
[58] Field of Search ............................. 315/248, 244, 315/349, 278, 279, 39, 34, 344, 249

[56] References Cited

U.S. PATENT DOCUMENTS

| | | | |
|---|---|---|---|
| 2,347,715 | 5/1944 | Spencer | 315/248 |
| 3,227,923 | 1/1966 | Marrison | 315/248 |
| 3,500,118 | 3/1970 | Anderson | 315/248 |
| 3,521,120 | 7/1970 | Anderson | 315/248 |
| 3,919,656 | 11/1975 | Sokal et al. | 330/51 |
| 3,987,334 | 10/1976 | Anderson | 315/57 |
| 3,987,335 | 10/1976 | Anderson | 315/62 |
| 4,010,400 | 3/1977 | Hollister | 315/248 |
| 4,017,764 | 4/1977 | Anderson | 315/248 |
| 4,024,431 | 5/1977 | Young | 315/248 |
| 4,048,541 | 9/1977 | Adams et al. | 315/248 |
| 4,117,378 | 9/1978 | Glascock, Jr. | 315/248 |
| 4,119,889 | 10/1978 | Hollister | 315/248 |
| 4,153,882 | 5/1979 | Fisher et al. | 330/10 |
| 4,166,234 | 8/1979 | Tak et al. | 313/486 |
| 4,171,503 | 10/1979 | Kwon | 315/248 |
| 4,178,534 | 12/1979 | McNeill et al. | 315/39 |
| 4,187,450 | 2/1980 | Chen | 315/282 |
| 4,206,387 | 6/1980 | Kramer et al. | 315/248 |
| 4,240,010 | 12/1980 | Buhrer | 315/248 |
| 4,245,178 | 1/1981 | Justice | 315/248 |
| 4,245,179 | 1/1981 | Buhrer | 315/248 |
| 4,253,047 | 2/1981 | Walker et al. | 315/248 |
| 4,254,363 | 3/1981 | Walsh | 315/248 |
| 4,260,931 | 4/1981 | Wesselink et al. | 313/493 |
| 4,376,912 | 3/1983 | Jernakoff | 315/248 |
| 4,383,203 | 5/1983 | Stanley | 315/248 |
| 4,390,813 | 6/1983 | Stanley | 315/248 |
| 4,422,017 | 12/1983 | Denneman et al. | 315/248 |
| 4,536,675 | 8/1985 | Postma | 313/46 |

(List continued on next page.)

FOREIGN PATENT DOCUMENTS

| | | | |
|---|---|---|---|
| 0021168 | 6/1979 | European Pat. Off. | H01J 65/00 |
| 0016542 | 10/1980 | European Pat. Off. | H01J 65/00 |
| 0162504 | 4/1984 | European Pat. Off. | H01J 65/04 |
| WO91/11017 | 7/1991 | WIPO | H01J 65/04 |

OTHER PUBLICATIONS

Brochure of the operating principles of the Philips QL lamp system, "QL Induction Lighting", Philips Lighting B.V., 1991.

N. O. Sokal et al., "Class E Switching–Mode RF Power Amplifiers—Low Power Dissipation, Low Sensitivity to Component Tolerances (Including Transistors), and Well–Defined Operation", IEEE Electro Conference, New York, Apr. 25, 1979.

*Primary Examiner*—William L. Sikes
*Assistant Examiner*—James A. Dudek
*Attorney, Agent, or Firm*—Skjerven, Morrill, MacPherson, Franklin & Friel; David E. Steuber

[57] ABSTRACT

A push-pull Class E amplifier is used to provide an efficient transfer of power to the induction coil in an electrodeless discharge lamp and to reduce the amount of radio frequency interference emitted by the lamp into the surrounding environment. A bifilar or other type of multifilar induction coil, preferably center-tapped, is used to further reduce the radio frequency interference problem.

16 Claims, 9 Drawing Sheets

U.S. PATENT DOCUMENTS

| | | | |
|---|---|---|---|
| 4,568,859 | 2/1986 | Houkes et al. | 315/248 |
| 4,622,495 | 11/1986 | Smeelen | 315/248 |
| 4,625,152 | 11/1986 | Nakai | 315/317 |
| 4,631,449 | 12/1986 | Peters, Jr. | 315/248 |
| 4,645,967 | 2/1987 | Bouman et al. | 315/317 |
| 4,661,746 | 4/1987 | Postma et al. | 315/248 |
| 4,675,577 | 6/1987 | Hanlet | 315/248 |
| 4,704,562 | 11/1987 | Postma et al. | 315/248 |
| 4,710,678 | 12/1987 | Houkes et al. | 315/39 |
| 4,727,294 | 2/1988 | Houkes et al. | 315/39 |
| 4,727,295 | 2/1988 | Postma et al. | 315/248 |
| 4,728,867 | 3/1988 | Postma et al. | 315/248 |
| 4,792,727 | 12/1988 | Godyak | 315/248 |
| 4,797,595 | 1/1989 | De Jong | 313/493 |
| 4,812,702 | 3/1989 | Anderson | 315/153 |
| 4,864,194 | 9/1989 | Kobayashi et al. | 315/248 |
| 4,894,590 | 1/1990 | Witting | 315/248 |
| 4,922,157 | 5/1990 | Van Engen et al. | 315/248 |
| 4,926,098 | 5/1990 | Tarrillo | 315/408 |
| 4,927,217 | 5/1990 | Kroes et al. | 315/248 |
| 4,940,923 | 7/1990 | Kroontje et al. | 315/248 |
| 4,952,844 | 8/1990 | Godyak et al. | 315/205 |
| 4,962,334 | 10/1990 | Godyak | 313/916 |
| 4,977,354 | 12/1990 | Bergervoet et al. | 315/248 |
| 4,987,342 | 1/1991 | Godyak | 315/49 |
| 5,006,752 | 4/1991 | Eggink et al. | 315/248 |
| 5,006,763 | 4/1991 | Anderson | 315/248 |
| 5,013,975 | 5/1991 | Ukegawa et al. | 315/248 |
| 5,013,976 | 5/1991 | Butler | 315/248 |
| 5,023,566 | 6/1991 | El-Hamamsy et al. | 315/251 |
| 5,059,868 | 10/1991 | El-Hamamsy et al. | 315/344 |
| 5,095,249 | 3/1992 | Roberts et al. | 315/248 |
| 5,107,185 | 4/1992 | El-Hamamsy et al. | 315/248 |
| 5,118,997 | 6/1993 | El-Hamamsy | 315/248 |
| 5,200,672 | 4/1993 | Sheynberg et al. | 315/248 |

ELECTRODELESS DISCHARGE LAMP CONTAINING PUSH-PULL CLASS E AMPLIFIER AND BIFILAR COIL

This application is a continuation application Ser. No. 08/230,451, filed Apr. 20, 1994, abandoned, which is a continuation of application Ser. No. 07/955,428, filed Oct. 1, 1992, abandoned, which is a continuation-in-part of application Ser. No. 07/894,020, filed Jun. 5, 1992, now U.S. Pat. No. 5,387,850.

FIELD OF THE INVENTION

This invention relates to electrodeless discharge lamps and in particular to an arrangement for a highly efficient electrodeless discharge lamp which generates acceptable levels of radio frequency interference.

BACKGROUND OF THE INVENTION

Electrodeless discharge lamps operate by using an induction coil to couple electromagnetic energy to a gas mixture, typically a metal vapor and an inert gas, which is enclosed in a sealed vessel. An oscillator is used to generate a high frequency signal which is amplified and delivered to the induction coil. Generally speaking, the lamp operates in two stages. In the start-up stage, the induction coil produces an electric field which ionizes some of the gaseous molecules, creating ions which in turn collide with other molecules, thereby producing further ions. This process continues until the steady-state stage is reached wherein a plasma of circulating charged particles is maintained, primarily by the magnetic field emanating from the induction coil. The stream of charged particles excites the metal vapor atoms, producing radiation, primarily in the UV spectrum, which impinges on a layer of phosphors which coats the walls of the vessel. As a result, the phosphors are excited and produce visible light.

This type of lamp is known as an electrodeless fluorescent lamp. Other types of electrodeless discharge lamps produce visible light directly from the gas contained in the sealed vessel.

Electrodeless discharge lamps, and in particular electrodeless fluorescent lamps, are much more efficient and long-lived than incandescent lamps. An electrodeless fluorescent lamp, for example, has a luminous efficacy of 60–80 lumens/watt, whereas tungsten incandescent lamps typically have a luminous efficacy of only 15–17 lumens/watt. Electrodeless discharge lamps accordingly offer the prospect of very significant energy savings. The development of this technology has been limited, however, by several problems, the foremost of these being the generation of radio frequency interference (RFI). The induction coil acts as an antenna. Even if the lamp operates at frequencies which are approved by the FCC (e.g., 6.78 or 13.56 MHz), the lamp typically generates harmonics of the fundamental frequency which are not within approved wavebands. Another problem has been to minimize losses which occur in the amplification of the high-frequency signal before it is delivered to the induction coil. These problems have been particularly troublesome because the apparatus used to solve them must fit within the confines of an electric light bulb and must not unduly raise the costs of manufacturing the light bulb.

Class E amplifiers are known to be highly efficient, and their use in an electrodeless discharge lamp is described in U.S. Pat. No. 4,245,178 to Justice. The theory underlying Class E amplifiers is described in U.S. Pat. No. 3,919,656 to Sokal et al., which is incorporated herein by reference. The Justice patent, however, describes only a single-ended Class E amplifier an offers no solution to the RFI problem. The single-ended Class E amplifier produces a half sine wave which is rich in harmonics. Moreover, Justice relies on a self-oscillating circuit, containing a feedback winding on a toroidal core, to provide the operational frequency of the lamp. This arrangement does not yield a stable frequency.

The principles of this invention offer a cost-effective solution to both the efficiency and RFI problems.

SUMMARY OF THE INVENTION

In accordance with this invention, a push-pull Class E amplifier, containing two switching elements, is used to amplify the high-frequency signal in an electrodeless discharge lamp. The push-pull amplifier is preferably balanced and produces a modified full sine wave which has a far lower harmonic content than a half sine wave.

An induction coil, which may be center-tapped and which together with the plasma constitutes the load, is directly coupled to a DC source. Capacitors are connected in parallel with the induction coil. The values of these capacitors are chosen to provide resonance with the induction coil at a frequency lower than the operating frequency, and thus the parallel combination looks like a capacitor at the operating frequency.

In a preferred embodiment, an inductor is connected in series with each of the switching elements (typically field effect transistors (FETs)). The inductors combine with the coil/capacitor combinations to provide a damped series resonant circuit which substantially reduces the energy losses which occur during the switching of the FETs by causing the overall circuit to operate in a Class E mode. The inductors are also used to match the impedance of the coil load to that of the switching elements. The capacitors, in conjunction with the inductors, form a low-pass filter which substantially reduces the harmonics which are delivered to the coil.

According to another aspect of the invention a bifilar or other type of multifilar induction coil is used preferably a center-tapped coil. A coaxial coil may also be used. The multifilar coil causes the electric field dipoles between adjacent windings of the coil to cancel out at distances removed from the coil, thereby substantially reducing the RFI problem.

DESCRIPTION OF THE INVENTION

Figure 1:
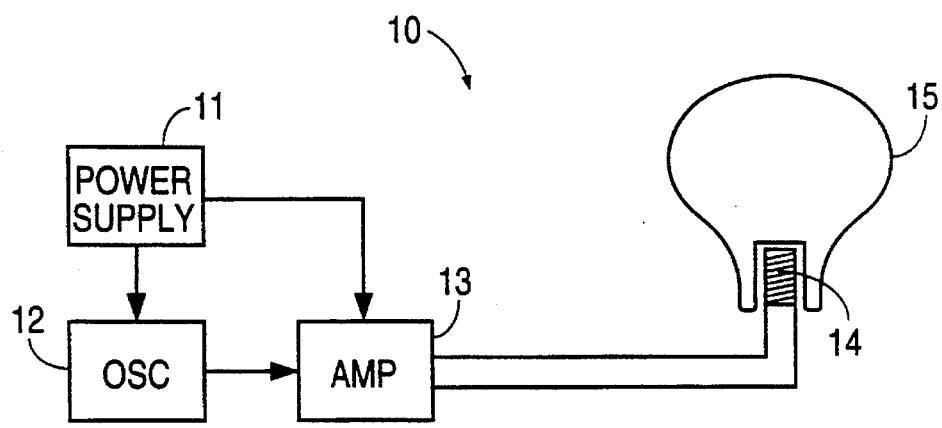
FIG. 1 illustrates a block diagram of an electrodeless discharge lamp.

A general block diagram of an electrodeless discharge lamp 10 is illustrated in FIG. 1. A power supply 11 rectifies the AC voltage from the power mains and supplies DC power to an oscillator 12 and an amplifier 13. Oscillator 12 is typically crystal driven. The amplified output of amplifier 13 is delivered to a cylindrical induction coil 14 which is situated in a cavity protruding into a sealed vessel 15. Sealed vessel 15 contains a mixture of a metal vapor, typically mercury, and a rare gas. When the high-frequency signal produced by oscillator 12 and amplified by amplifier 13 is delivered to induction coil 14, electric and magnetic fields are created inside vessel 15, and a plasma of charged particles is formed, as described above. The circulating charged particles collide with the metal vapor atoms, exciting them and causing them to emit radiation. In a fluorescent discharge lamp, the radiation is generally in the UV spectrum and impinges on phosphors which are coated on the inside of vessel 15. This excites the phosphors which in turn emit visible radiation. In other types of electrodeless discharge lamps, visible light is emitted directly by the gaseous atoms. The principles of this invention are applicable to both types of electrodeless discharge lamps. Moreover, while induction coil 14 is illustrated as being coreless, the principles of this invention also apply to induction coils having a magnetic core.

As described above, two of the main problems in developing this technology have been in minimizing the transmission of radiation from coil 14 into the surrounding environment, including both the fundamental and harmonics of the frequency at which oscillator 12 operates, and minimizing losses in the transfer of power from power supply 11 to induction coil 14.

Figure 2A:
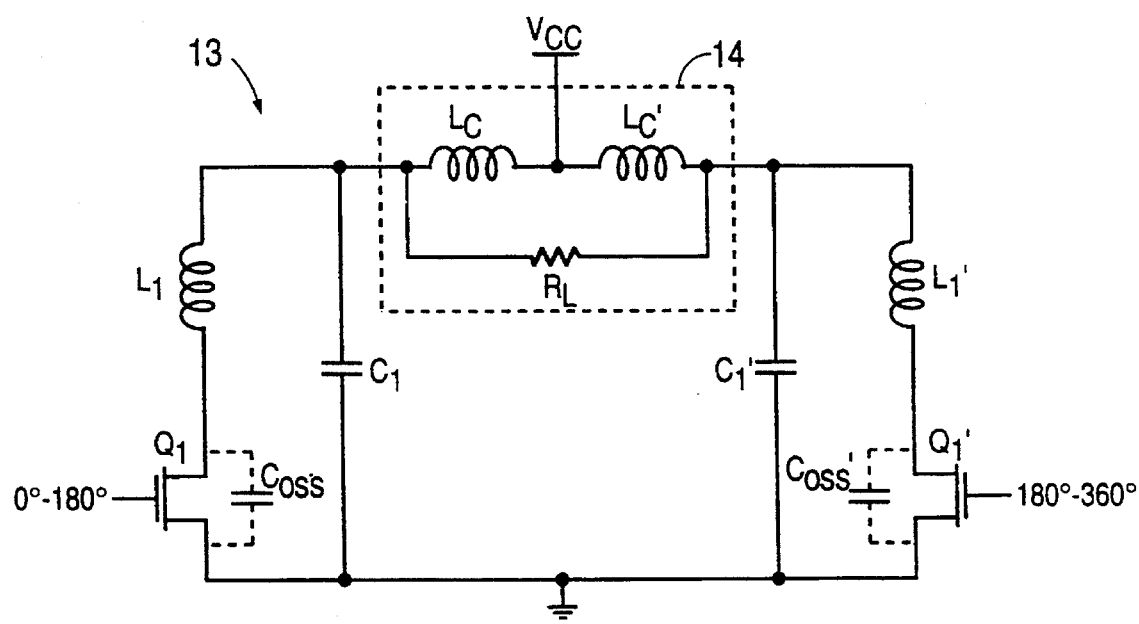
FIG. 2A illustrates a circuit diagram of a preferred embodiment of an amplifier in accordance with the invention.

Both of these problems are alleviated in the embodiment of amplifier 13 illustrated in FIG. 2A. Amplifier 13 is shown as a Class E amplifier of the push-pull variety. Induction coil 14 is center-tapped and is represented schematically as two inductors $L_C$ and $L_C'$ with an equivalent parallel resistor $R_L$ representing the loading effect of the plasma. Amplifier 13 includes switching field effect transistors (FETs) $Q_1$ and $Q_1'$, each of which operates out of phase with the other (i.e., one of the FETs is turned off when the other FET is turned on, referred to herein as the "push-pull mode") and has a duty cycle of 50%. The duty cycles of FETs $Q_1$ and $Q_1'$ may be reduced, however, without departing from the principles of this invention. Inductors $L_1$ and $L_1'$ are connected in series with induction coil 14, and capacitors $C_1$ and $C_1'$ are interposed between the respective sides of induction coil 14 and ground. FETs $Q_1$ and $Q_1'$ are shown as having inherent capacitances $C_{oss}$ and $C_{oss}'$, respectively.

The preferred embodiment is completely balanced, which means that $Q_1$ and $Q_1'$ are identical FETs, and $L_1=L_1'$, $C_1=C_1'$, and $L_C=L_C'$.

Several general observations will assist in understanding the design and operation of the circuit illustrated in FIG. 2.

The components which represent center-tapped induction coil 14 ($L_C$, $L_C'$ and $R_L$), together with capacitors $C_1$ and $C_1'$, act as a capacitance at the operating frequency. This capacitive unit operates in conjunction with inductors $L_1$ and $L_1'$, respectively, to form a damped resonant circuit which minimizes the switching power losses in FETs $Q_1$ and $Q_1'$ in accordance with the teachings of the above-referenced U.S. Pat. No. 3,919,656 to Sokal et al. These relationships assure that the voltage across FETs $Q_1$ and $Q_1'$ is substantially equal to zero (actually VDS(SA) when they turn off, and that the voltage across and current through FETs $Q_1$ and $Q_1'$ are substantially zero when they turn on. As described in the Sokal et al. patent and elsewhere, satisfaction of these conditions (referred to herein as the "Class E conditions") minimizes the power losses (voltage×current) in the intervals during which FETs $Q_1$ and $Q_1'$ are switching between their on and off states.

Inductors $L_1$ and $L_1'$ provide impedance matching and capacitors $C_1$ and $C_1'$ act as low-pass filters, minimizing harmonics of the fundamental frequency (determined by oscillator 12) from reaching induction coil 14.

The design of amplifier 13 involves finding the optimal compromise among several competing factors. The following describes a general methodology for this process.

1. The inductance and load of induction coil 14 are defined for the situation in which it is operating in an energized electrodeless discharge lamp.
2. FETs $Q_1$ and $Q_1'$ are selected to have output capacitances and breakdown voltages consistent with the power output requirements of the amplifier.
3. The capacitance ($C_x$) required to produce resonance with induction coil 14 at the desired operating frequency is calculated
4. The values of the series inductors $L_1$ and $L_1'$ are calculated such that they provide the impedance transformations necessary to match the impedance of induction coil 14 to the respective impedances of FETs $Q_1$ and $Q_1'$.
5. The values of capacitors $C_1$ and $C_1'$ are calculated to provide a series resonance at the desired operating frequency with one of FETs $Q_1$ and $Q_1'$ turned on.
6. Using the calculated values, the performance of the damped resonant circuit is simulated on a computer to obtain the optimal voltage waveform at the drain terminals of FETs $Q_1$ and $Q_1'$, i.e., starting with V=0, when the FET turns off, the voltage at the drain terminals should vary such that V=0 and dV/dt=0 when the FET turns on.
7. The supply voltage $V_{CC}$ necessary to provide the desired output power is selected.
8. A breadboard with the component values obtained from the computer simulation is built and tested and those values are adjusted as necessary to meet the "Class E conditions" as described above, with a selected coil/plasma combination.

As will be appreciated by those skilled in the art, elements such as the coil inductance, plasma load impedance, parasitic coil capacitance, coil and capacitor tolerances, FET parasitic variations, the amplitude/impedance of the gate drive signal, and the layout parasitics will all have some impact on the design. The final solution will be the best compromise taking into account all of these variables.

An example of the method of constructing an amplifier in accordance with this invention will now be given. In the example, it is assumed that $L_C=L_C'=1.15$ μH, $R_L=4$ KΩ, the coupling factor K=0.9, and loaded Q≅10. $Q_1$ and $Q_1'$ are FETs with an inherent capacitance $C_{oss} \cong 40pF$ and a breakdown voltage Vp=200 V. The lamp will operate at $f_o$=13.56 MHz.

The power output $P_o$ is governed by the following relationship.

$$P_o \cong 0.8 C_{oss} V_p^2 f_o$$

which yields $P_o \cong 18$ Watts.

The capacitance $C_x$ required to resonate with the induction coil is defined as follows:

$$C_x = \frac{1}{4\pi^2 f_o^2 4 L_c}$$

$$C_x \cong 30 \text{ pF}$$

To keep the amplifier balanced, double of this capacitance (60pF) should be located on either side of induction coil 14.

Next, the value of the series inductors $L_1=L_1'$ is calculated, so as to provide impedance matching between induction coil 14 and FETs $Q_1$ and $Q_1'$, respectively. The following equation describes this relationship:

$$\frac{R_L}{Q^2} \left( \frac{4L_c + 2L_1}{4L_c} \right)^2 = \frac{V_p^2}{2P_o}$$

Inserting values for $R_L$, Q, $V_p$ and $P_o$ yields:

$$\left( \frac{4L_c + 2L_1}{4L_c} \right)^2 \cong 25$$

$$\frac{4L_c + 2L_1}{4L_c} \cong 5$$

Since $L_c$=1.15 µH, we get $2L_1$=18.4 µH $L_1$=9.2 µH

Accordingly, the condition of impedance matching yields the series inductance $L_1=L_1'$=9.2 µH.

Next, $C_1=C_1'$ is calculated so as to provide a series resonance at $f_o$=13.56 MHz with one of FETs $Q_1$ or $Q_1'$ turned on. (Although the actual frequency of the series resonant circuit should be slightly greater than $f_o$ to satisfy the Class E conditions, the resulting error can easily be corrected through simulation and testing.)

$$f_o \cong \frac{1}{2\pi \sqrt{2L_1 \frac{\left(\frac{C_1}{2} - C_x\right) C_{oss}}{\frac{C_1}{2} - C_x + C_{oss}}}}$$

This expression can be solved for $C_1$.

$$C_1 = 2 \left[ \frac{C_{oss} + C_x(1 - 8\pi^2 f_o^2 L_1 C_{oss})}{1 - 8\pi^2 f_o^2 L_1 C_{oss}} \right]$$

$$C_1 = 2 \left[ \frac{C_{oss}}{1 - 8\pi^2 f_o^2 L_1 C_{oss}} + C_x \right]$$

$$C_1 \cong 120 \text{ pF}$$

Figure 4:
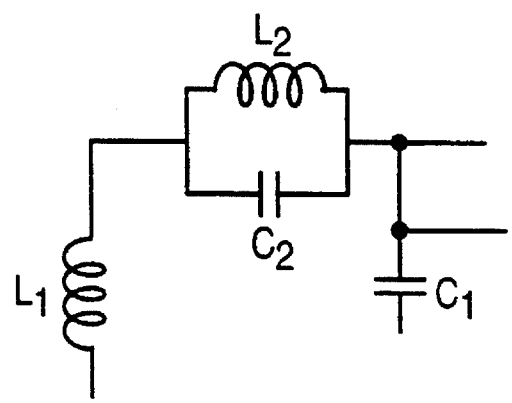
FIG. 4 illustrates a circuit diagram of a frequency trap which may be used in conjunction with the invention.

The values of $L_1$ and $C_1$ are further refined by simulation and testing, as described above. In most situations, the values obtained from $L_1$ and $C_1$ will assure that these elements will act as a low pass filter with regard to harmonics above the fundamental frequency. In the event that a specific harmonic frequency requires further attenuation, a frequency trap in the form illustrated in FIG. 4, containing a capacitor $C_2$ and an inductor, may be interconnected between series inductor $L_1$ and induction coil 14. A similar trap may be connected between series inductor $L_1'$ and induction coil 14.

Figure 3:
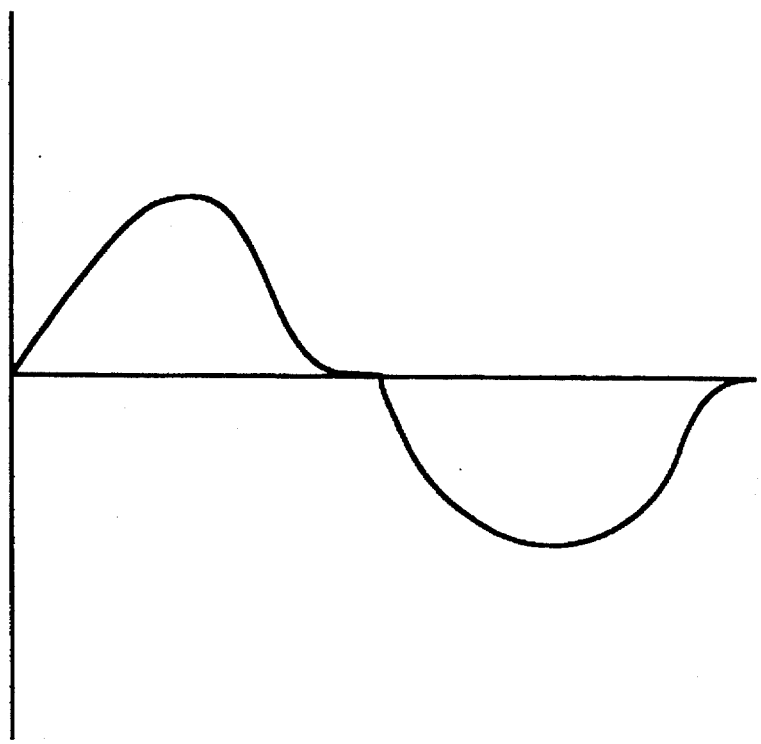
FIG. 3 illustrates a waveform produced by the amplifier of this invention.

Unlike a single-ended Class E amplifier such as is described in the above-referenced U.S. Pat. No. 4,245,178 to Justice, the push-pull amplifier of this invention provides a modified full sine wave having a form of the kind generally shown in FIG. 3. This waveform has a far lower harmonic content than the half wave output of a single-ended Class E amplifier.

Figure 2B:
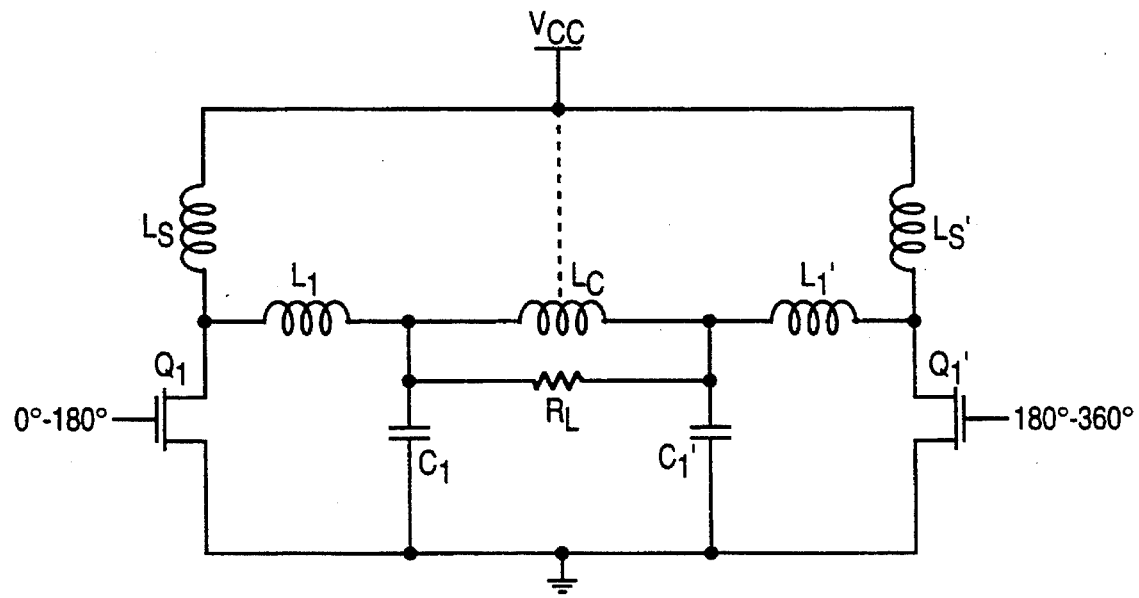
FIGS. 2B, 2C and 2D illustrate circuit diagrams of alternative embodiments in accordance with the invention.
Figure 2C:
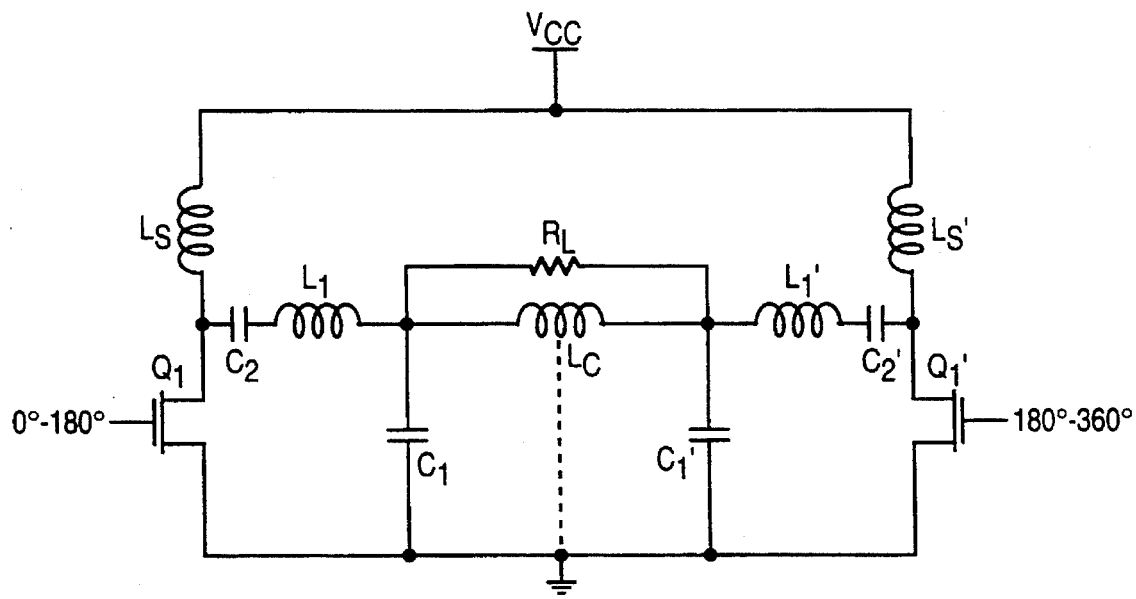

FIGS. 2B and 2C illustrate alternative embodiments of an amplifier in accordance with this invention. The amplifier shown in FIG. 2B is a choke-coupled, DC-connected circuit arrangement, and the amplifier shown in FIG. 2C is a choke-coupled, AC-connected circuit arrangement. The induction coil $L_C$ may or may not have a center tap, as illustrated by the hatched line.

Figure 2D:
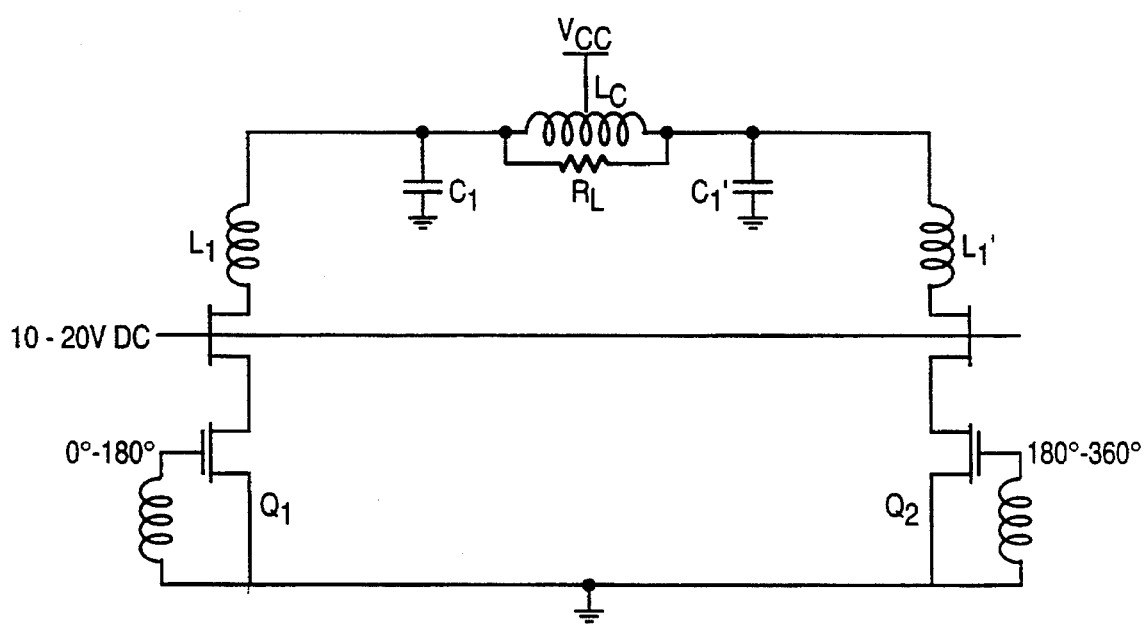

FIG. 2D illustrates a cascoded circuit arrangement in which the input capacitances of transistors $Q_1$ and $Q_2$ are less and Miller Feedback effects are minimized and therefore a smaller driver can be used.

Figure 5A:
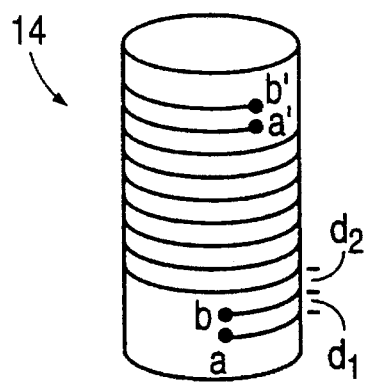
FIG. 5A illustrates a bifilar coil in accordance with another aspect of this invention.
Figure 5B:
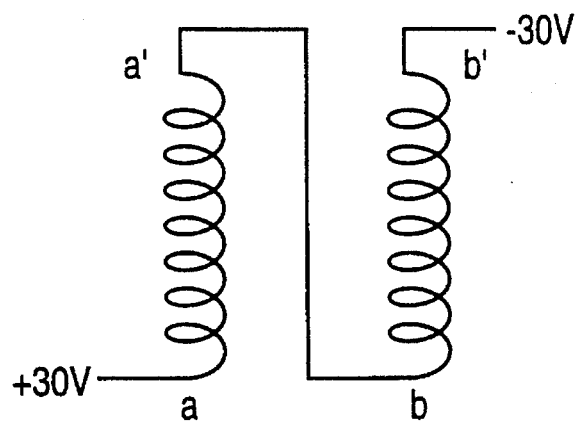
FIG. 5B illustrates a schematic diagram of the bifilar coil.

It has been found that the radio frequency interference (RFI) problem is significantly reduced if the induction coil is bifilar. FIG. 5A illustrates a bifilarly wound induction coil 14. Starting at point a, the coil is wound to point a', where the wire is brought down on the inside of the coil to point b from which it is wound side-by-side with the first winding up to point b'. This arrangement is illustrated schematically in FIG. 5B. Each spiral segment of wire between points where the winding begins (e.g., point a) and where it ends (e.g. point a') is referred to herein as a separate "winding." Individual passes around the coil support are referred to as "turns".

Figure 6:
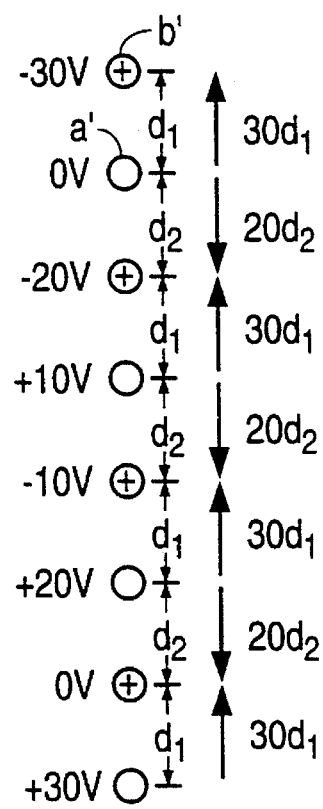
FIG. 6 illustrates a cross-sectional view of the wires in the bifilar coil showing the electric field adjacent the wires.

This technique significantly reduces the electric field at points distant from the induction coil while maintaining a strong electric field at points near the coil where it is needed to start the ionization process in the discharge vessel. The reasons for this, as presently understood, are illustrated in FIG. 6, which is a cross-sectional view of the coil winding taken through a radial plane. It is assumed that the peak-to-peak voltage is 60 V, with ends a and b' oscillating between +30 V and −30 V. The coil is shown when point a is at +30 V and point b' is at −30 V. The turns from point a to point a' are shown as open circles and the turns from point b to point b' are shown as crossed circles. The voltages shown in FIG. 6 are for illustration only, the actual voltage between points a and b' may be on the order of 200 V to 300 V.

As FIG. 6 indicates, the voltage decreases by 10 V for each turn from point a, until it reaches 0 V at point a'. The voltage at point b is the same as at point a', and from point b to point b' the voltage decreases 10 V for each turn to 30 V at point b'.

A distance $d_1$ is shown as the distance between the two windings and the distance $d_2$ is equal to the pitch of each winding less the distance $d_1$. The result, therefore, is a series of dipoles having a strength equal to the distance between adjacent wires multiplied by the voltage difference between the wires. The strength and direction of each dipole is indicated on the right side of FIG. 6. It is apparent that successive dipoles are in opposite directions and will be equal if:

$$30d_1 = 20d_2$$

or $$d_2 = 1.5 d_1$$

For a bifilarly wound coil having n turns in each half, this expression can be generalized to:

$$\frac{d_1}{d_2} = 1 - \frac{1}{n}$$

When this condition is satisfied, the dipoles substantially cancel out at points well removed from the coil (for example, greater than 10 times the coil length), while the strength of the electric field at points near the coil is enhanced as compared with the field near a single-wound coil. For example the dipole between points a and b in FIG. 6 is $30d_1$, whereas if the coil were single-wound (8 turns), the strength of the dipole would be equal to $10d_1$.

The strength of the far electric field of a bifilarly wound coil having n turns can be approximated as $$E_{bifilar} \cong \frac{V_{rms}^2}{4n^2 r^4}$$

By comparison, the far field for a simple solenoid is approximated as:

$$E_{solenoid} \cong \frac{V_{rms}^2}{r^2}$$

Accordingly, the suppression of the electric field is directly proportional to the number of turns of the bifilar coil.

$$\text{Suppression} = 10 \log^{10}\left[\frac{E_{bifilar}}{E_{solenoid}}\right] = -20 \log_{10}(2n)$$

Figure 7A:
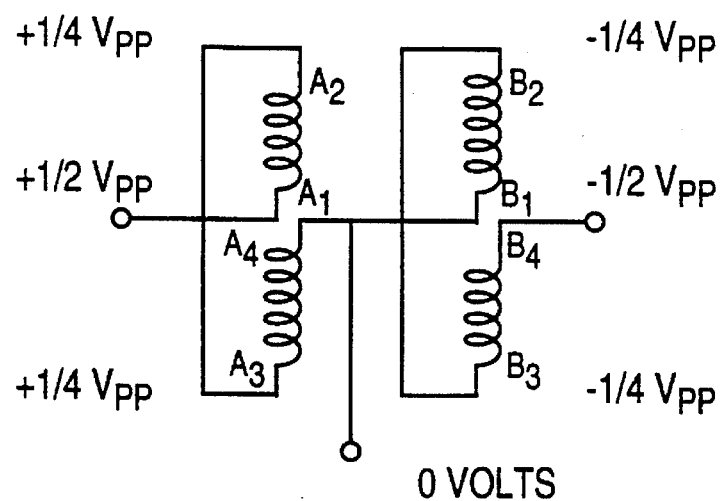
FIG. 7A illustrates schematically a center-tapped bifilar coil.

The center-tapped bifilar coil illustrated schematically in FIG. 7A is particularly advantageous for the induction coils illustrated in FIGS. 2A–2D. Starting and finishing the winding of the coil at the center creates a more symmetrical configuration and provides improved far field suppression. Moreover, the near electric field at the center of the coil is strengthened by the close proximity of coil windings having a voltage difference of $V_{pp}$ (+½$V_{pp}$ to -½$V_{pp}$).

Figure 7B:
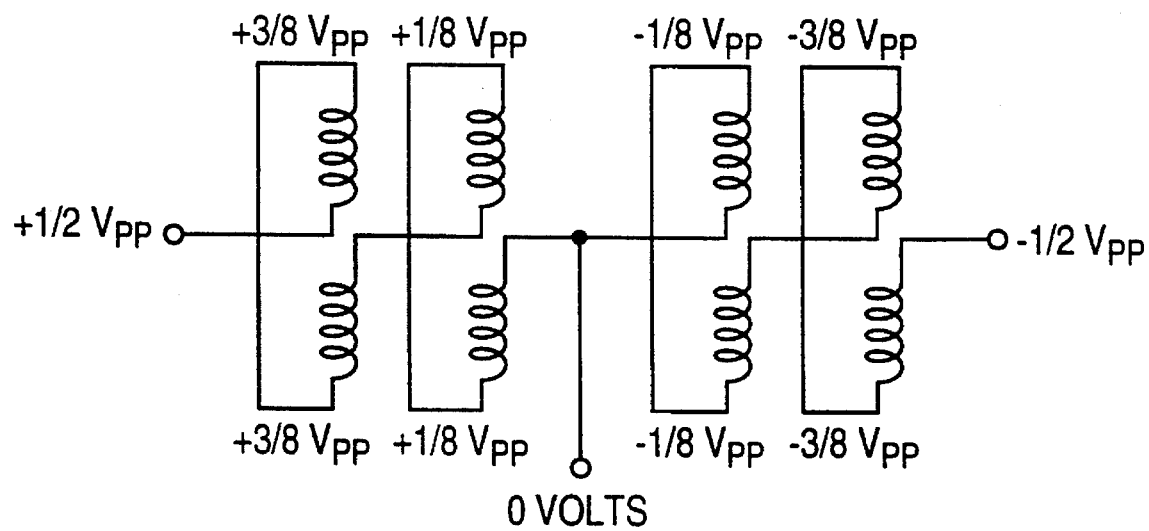
FIG. 7B illustrates a center-tapped quadrifilar coil.

The principles of this invention extend to multifilar coils having any number of windings located side-by-side one another. For example, FIG. 7B illustrates a quadrifilar coil.

In addition to the far field cancellation of the bifilar coil there are other benefits in minimizing the reradiation of signals by the plasma itself.

Plasma radiation at any frequency can be split into two components:

(a) Radiation due to the currents and voltages induced in the plasma by the magnetic coupling.

(b) Common mode voltages induced in the plasma by coupling to the induction coil.

The induced magnetic coupling component can be reduced by minimizing the harmonic content of the signal driving the induction coil. The plasma itself does not create harmonics which are large enough to be considered.

Figure 8A:
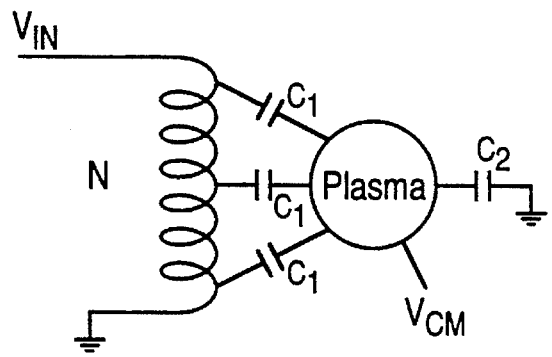
FIGS. 8A, 8B and 8C illustrate the common mode voltage associated with a single ended coil, a center tapped coil and a bifilar coil, respectively.
Figure 8B:
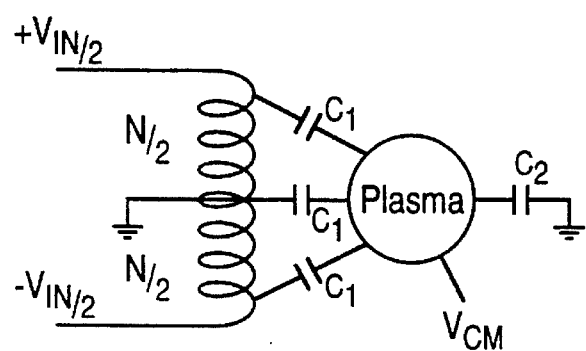
Figure 8C:
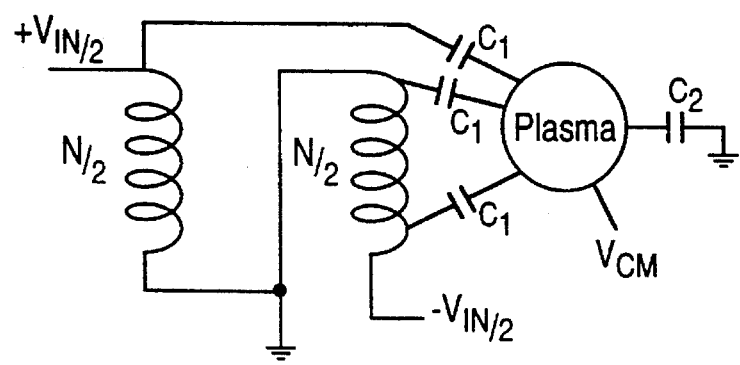

The common mode induced voltage can be analyzed by assuming capacitive coupling between the induction coil and the plasma as shown in FIGS. 8A, 8B and 8C.

A simple analysis reveals that the common mode voltage $V_{CM}$ for the configurations illustrated in Figures 8A, 8B and 8C is approximated by the expressions:

Single ended coil (FIG. 8A):

$$V_{CM} \approx \frac{V_{IN} C_1}{N C_2}\left[\sum_1^N x\right]$$

Center tapped coil (FIG. 8B):

$$V_{CM} \approx \frac{2 V_{IN} C_1}{N C_2}\left[\sum_1^{\frac{N}{2}} x - \sum_1^{\frac{N}{2}} x\right] \approx 0$$

Bifilar coil (FIG. 8C):

$$V_{CM} \approx \frac{2 V_{IN} C_1}{N C_2}\left[\sum_1^{\frac{N}{2}} x - \sum_1^{\frac{N}{2}} x\right] \approx 0$$

where $V_{1N}$ is the rms voltage delivered to the coil, $C_1$ is the capacitance between a single turn of the coil and the plasma, $C_2$ is the capacitance between the plasma and ground, N is the total number of turns in the coil, and x is a variable number.

As can be seen, a balanced coil configuration has substantially zero common mode induced voltage in the plasma while the single ended coil has a finite common mode value. Any imbalance effects due to physical tolerances, electrical imbalances, and imbalanced ground effects will have second order effects.

Common mode coupling and hence reradiation and RFI signals can be minimized by (a) Using multifilar coil configurations to enhance coupling between each half of the coil and to minimize electrical imbalances.

(b) Improving balance such as using a center feed and/or quadrifilar coil configuration.

(c) Providing a balanced push-pull drive to the induction coil.

(d) Increasing the value of $C_2$ by an external grounded shield, as described in commonly owned application Ser. No. 07/883,8750, incorporated herein by reference.

(e) Providing an electrical shield between the induction coil and the plasma, as described in commonly owned application Ser. No. 07/883,972, incorporated herein by reference.

Figure 9:
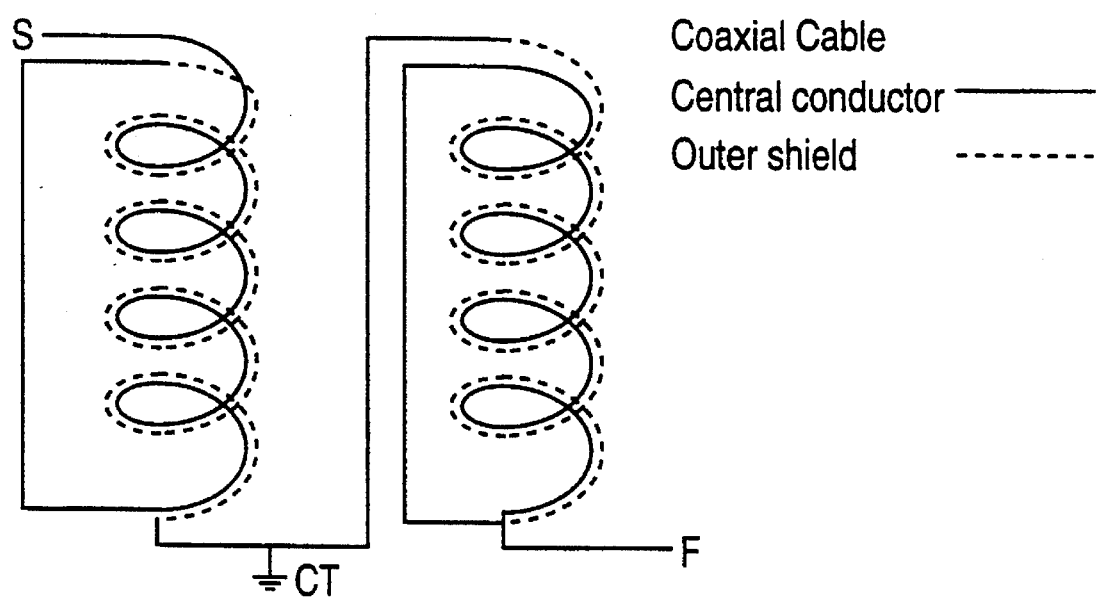
FIG. 9 illustrates an embodiment including a coaxial coil.

It may be preferable to use a coaxial cable in some situations, with the central conductor and shield, respectively, being connected in the same manner as the side-by-side windings described above. FIG. 9 illustrates schematically one embodiment of such a configuration. In FIG. 9, the solid line represents the central conductor and the hatched line represents the outer shield of the coaxial cable. A center-tapped configuration is shown, with the center tap CT being located midway between the start S and the finish F.

Alternatively, it may be desirable to twist the side-by-side lines in some applications.

Figure 10A:
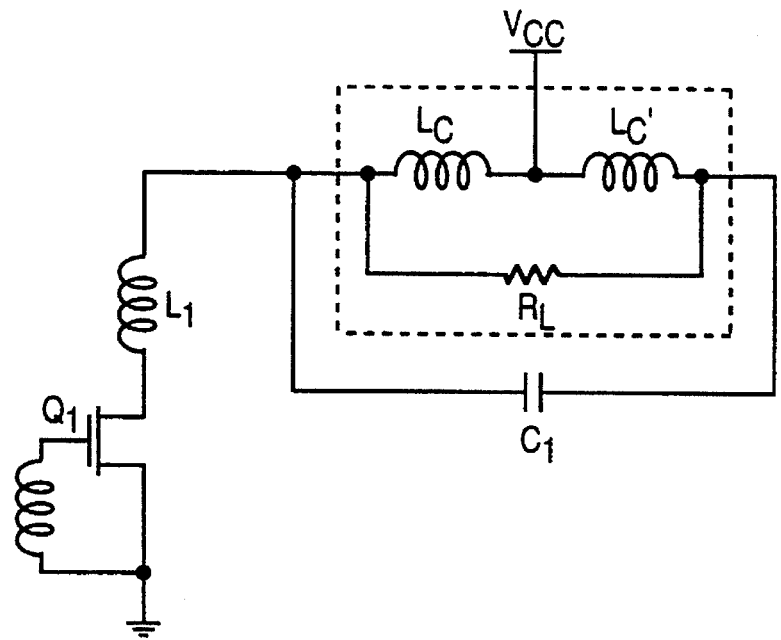
FIGS. 10A and 10B illustrate embodiments including a multifilar coil and a single-ended driving amplifier.
Figure 10B:
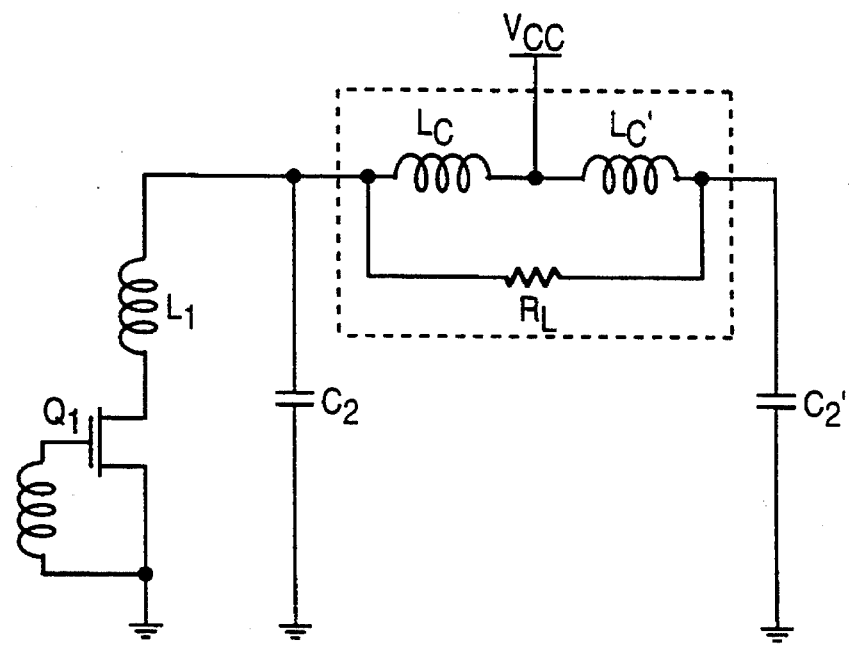

A multifilar coil may also be used with a single-ended driving amplifier, i.e., a single source driving a load which is connected to the source at one end and grounded at the other end. In this configuration, the signal across the multifilar coil energizing the plasma is balanced and thus the benefits of low RFI and low common impedance coupling to the plasma are obtained. Two possible configurations using a single FET in a Class E mode are illustrated in FIGS. 10A and 10B. In both figures, inductor $L_1$ functions as a series choke for the induction coil. FET Q may advantageously be an IRF 710. The difference between the embodiments shown in FIGS. 10A and 10B is that the embodiment of FIG. 10A uses a single tuning capacitor $C_1$ whereas the embodiment of FIG. 10B uses a pair of tuning capacitors $C_2$ and $C_2'$. Preferably, if the other elements of the circuits are the same, the value of C should be equal to one-half the values of $C_2$ and $C_2'$ (which should be equal).

While using a multifilar coil with a single-ended amplifier will generally not give a signal conversion that is quite as good as that obtained with a balanced (push-pull) drive, the results will nonetheless be superior to those obtained with a normal single-wound coil.

The embodiments described above are intended to be illustrative and not limiting. Accordingly, many other embodiments will be apparent to those skilled in the art, all of which are within the broad scope of this invention, which is defined in the following claims. For example, push-pull Class E amplifiers having circuits different from the one illustrated in FIG. 2 may be found suitable in certain situations.

We claim:

1. An electrodeless discharge lamp comprising:
   a sealed vessel containing a gaseous mixture;
   an induction coil positioned adjacent said sealed vessel for generating a plasma of charged particles within said sealed vessel;
   an oscillator for generating an oscillating electrical signal at a predetermined frequency;
   an amplifier for amplifying said oscillating signal,
   wherein said induction coil includes a plurality of windings and is wound multifilarly, the individual turns of one of said windings being positioned adjacent the individual turns of another of said windings on a coil support, at least two of the windings being connected in a conduction path between the output terminals of said amplifier.

2. The electrodeless discharge lamp of claim 1 wherein said amplifier comprises a first switch and a second switch and a damped resonant circuit connected to said first and second switches, and wherein said induction coil constitutes a component in said damped resonant circuit.

3. The electrodeless discharge lamp of claim 2 wherein said induction coil has a center tap, said center tap being connected to a constant voltage.

4. The electrodeless discharge lamp of claim 3 wherein said damped resonant circuit comprises inductors, the values of said inductors being selected to match the impedance of said induction coil to the impedance of said first and second switches, respectively.

5. The electrodeless discharge lamp of claim 4 wherein said inductors are connected in series between said first switch and said induction coil and in series between said second switch and said induction coil.

6. The electrodeless discharge lamp of claim 4 wherein said damped resonant circuit comprises capacitors, the values of said capacitors being selected so as to provide resonance with the induction coil at a frequency lower than the frequency of said oscillator.

7. The electrodeless discharge lamp of claim 1 wherein each of said first and second switches comprises a transistor.

8. The electrodeless discharge lamp of claim 1 which each of said first and second switches comprises a field effect transistor.

9. The electrodeless discharge lamp of claim 1 comprising means for resonating which, in conjunction with said induction coil, has a natural frequency substantially equal to the frequency of said oscillator.

10. The electrodeless discharge lamp of claim 9 comprising means for transforming the impedance of said induction coil so as to match the impedance of said induction coil to the impedance of said first and second switches, respectively.

11. The electrodeless discharge lamp of claim 10 comprising means for filtering electrical signals having frequencies substantially greater than the frequency of said oscillator.

12. The electrodeless discharge lamp of claim 1 wherein said induction coil is wound bifilarly.

13. The electrodeless discharge lamp of claim 1 wherein said induction coil is wound quadrifilarly.

14. An electrodeless discharge lamp comprising an induction coil for coupling electromagnetic energy to a gas contained in a sealed vessel, an oscillator and an amplifier, said amplifier satisfying the Class E conditions and operating in the push-pull mode, said induction coil including a plurality of windings and being wound multifilarly, the individual turns of one of said windings being positioned adjacent the individual turns of another of said windings on a coil support, at least two of the windings being connected in a conduction path between the output terminals of said amplifier.

15. An electrodeless discharge lamp comprising:
    a sealed vessel containing a gaseous mixture;
    an induction coil positioned adjacent said sealed vessel, said induction coil being bifilar and comprising a coaxial cable, said induction coil having plurality of windings, the individual turns of said windings being positioned adjacent each other on a coil support, at least two of the windings being connected in a conduction path between the output terminals of said amplifier;
    means for generating an oscillating electrical signal at a predetermined frequency;
    an amplifier for amplifying said oscillating signal, said amplifier comprising:
      a first switching means and a second switching means, said first and second switching means being turned on out of phase with each other such that one of said first and second switching means is in an off condition when the other of said switching means is in an on condition;
      a damped resonant circuit connected between said first and second switching means, said damped resonant circuit resonating when one of said first and second switching means is in an off condition in such a way that the voltage across each of first and second switching means is substantially zero when said switching means turns off and the voltage across and current through each of said first and second switching means are substantially zero when said switching means turns on.

16. An electrodeless discharge lamp comprising:
    a sealed vessel containing a gaseous mixture;
    means for generating an oscillating signal at a predetermined frequency;
    an amplifier for amplifying said oscillating signal, said amplifier having pair of output terminals;
    a bifilar induction coil positioned adjacent said sealed vessel, said bifilar induction coil having a plurality of windings, the individual turns of said windings being positioned adjacent each other on a coil support, at least two of said windings being connected in a conduction path between the output terminals of said amplifier said induction coil comprising a coaxial cable.

* * * * *